(12) United States Patent
Doblar et al.

(10) Patent No.: US 6,714,433 B2
(45) Date of Patent: Mar. 30, 2004

(54) MEMORY MODULE WITH EQUAL DRIVER LOADING

(75) Inventors: Drew G. Doblar, San Jose, CA (US); Han Y. Ko, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/882,701

(22) Filed: Jun. 15, 2001

(65) Prior Publication Data

US 2003/0043613 A1 Mar. 6, 2003

(51) Int. Cl.[7] .................................................. G11C 5/06
(52) U.S. Cl. ....................... 365/63; 365/51; 365/230.03
(58) Field of Search ........................ 365/63, 51, 230.03

(56) References Cited

U.S. PATENT DOCUMENTS

| | | | | |
|---|---|---|---|---|
| 5,260,892 A | * | 11/1993 | Testa | 365/63 |
| 5,319,591 A | * | 6/1994 | Takeda et al. | 365/63 |
| 5,790,447 A | * | 8/1998 | Laudon et al. | 365/52 |
| 5,831,890 A | * | 11/1998 | Selna et al. | 365/51 |
| 5,973,951 A | | 10/1999 | Bechtolsheim et al. | |
| 6,038,132 A | | 3/2000 | Tokunaga et al. | |
| 6,370,053 B2 | | 4/2002 | Chang et al. | |
| 6,407,962 B1 | | 6/2002 | Ka | |
| 6,414,868 B1 | * | 7/2002 | Wong et al. | 365/51 |
| 6,442,718 B1 | | 8/2002 | Tran et al. | |
| 6,515,922 B1 | | 2/2003 | Yamagata | |

OTHER PUBLICATIONS

Texas Instruments, "Logic Solutions for PC100 SDRAM Registered DIMMs" *SMOA001A* (May 1998).
Texas Instruments, "SN74ALVCH162830 1–bit to 2–bit Address Driver with 3–State Outputs" *SCES082G*—(Aug. 1996—Revised Jun. 1999).

* cited by examiner

*Primary Examiner*—Son T. Dinh
(74) *Attorney, Agent, or Firm*—Meyertons Hood Kivlin Kowert & Goetzel, P.C.; B. Noël Kivlin

(57) ABSTRACT

A memory module comprising a printed circuit board having mounting locations for a plurality of memory chips. A line driver having a plurality of outputs for each input is used to drive address and control signals to the chips, with each set of outputs coupled to a subset of the chips. Memory access time is improved by limiting subset size and thereby limiting driver loading. Subsets may correlate to banks of memory chips. Access time is substantially the same for a module with a plurality of banks of memory chips as it is for a module with only one bank of chips. Computer memory may be efficiently exchanged by using only such memory modules, allowing higher clock speed since the range of memory access times is reduced and requiring no change to system memory configuration or settings. Memory modules having differing capacities can be easily interchanged in the system.

26 Claims, 2 Drawing Sheets

MEMORY MODULE WITH EQUAL DRIVER LOADING

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

This invention relates to memory expansion modules for expanding memory in computer systems and more particularly to modules having reduced and substantially equal loads on signal drivers and minimized access times.

Many modern computer systems allow for memory expansion by way of single inline memory modules (SIMMs) and/or dual inline memory modules (DIMMs). Typically, SIMMs and DIMMs include small, compact circuit boards that are designed to mount easily into an expansion socket mounted on another circuit board, such as a computer motherboard. To mount in the expansion socket, SIMMs and DIMMs typically include an edge connector comprising a plurality of contact pads, with contact pads typically being present on both sides of the circuit board. On SIMMs, opposing contact pads are connected together (i.e. shorted), and thus carry the same signal, while at least some of the opposing contact pads on DIMMs are not connected, thus allowing different signals to be carried. Due to this, higher signal density may be accommodated by DIMMs.

Memory elements mounted on SIMMs and DIMMs are typically Dynamic Random Access Memory (DRAM) chips or Synchronous Dynamic Random Access Memory (SDRAM) chips. In either case, the chips must be supplied with various address, control, and data signals for reading data from, or writing data to, the memory chips. It should be recognized that each input to a memory chip represents a load, mostly capacitive, on the signal driver driving it. In addition, printed circuit board conductors (often called traces) which connect a signal driver to the chip inputs also represent loads which may include inductance as well as capacitance and resistance. The total load on a signal driver includes the sum of the chip inputs connected to the line and loading associated with the conductors which carry the signals to the various chip inputs. When the output at a signal driver changes state, e.g. from logical zero to logical one, it takes some time for the signal levels at the chip inputs to reach and stabilize at the desired voltage. This "settling" or stabilization time is related to the characteristics of the circuit including the power driving the signal line and the loading on the line. This settling time must be included in calculating the minimum time required to access a memory device. Accordingly, this settling time can limit the maximum speed at which the system incorporating the memory may operate.

SIMMs and DIMMs can have various total memory capacities; for example, 64, 128 or 256 megabyte capacities. The various capacities may be selected in several ways. The first is selection of memory chips having a given address space and byte size. For example, a chip may have a four-megabyte address space, i.e. four million separate addressable memory locations, with each byte being sixteen bits. Such a chip can provide storage of four million sixteen-bit words. Second, for a given size of memory chip, module capacity can be increased by using multiple chips on a board and increasing data bus width so that the data at an addressed location in each chip can be read out to the bus simultaneously. For example, if three four megabyte chips with sixteen bit bytes are used, the bus width would need to be at least forty-eight to allow the bytes at a selected address on each chip to be read out to the bus at the same time. A module with three four megabyte chips with sixteen bit bytes can be considered to have a total capacity of twelve million sixteen bit bytes, but may be called a twenty-four megabyte memory because an eight bit byte is often considered to be the standard byte size. A memory subsystem or decoder may then select which of the bytes is the one, or two in case the system is using sixteen-bit words, which has been requested based on its position on the bus. Third, if it is desired to add more chips without increasing the data bus width, the memory chips may be arranged in banks with their data outputs coupled to one set of data bus lines. For example, two banks each having three of the above-described chips can be placed on one board, with each bank having its data outputs coupled to the same forty-eight data bus conductors. An additional address line, or bank select line, may then be used to select only one bank to be actively connected to the data bus at any given time. Such a two-bank module would have twice the total capacity of a module with only one bank.

The fact that memory modules may be implemented with various numbers of chips can cause a problem in overall computer system operation. Typically, a module having more memory chips represents a larger load on the address and control signal lines. This increased load increases the time for signals to stabilize at the memory chip inputs, thereby increasing the required memory access time and generally slowing system operation. The memory system clock must be selected to accommodate the memory access time for all memory modules. Accordingly, the clock must be selected to operate properly with the modules having the longest access time. It would be desirable to minimize the access time for memory modules to allow increased clock speed and thus enhanced system performance. In addition, it would be desirable to have modules with substantially the same access time regardless of their capacity or number of memory chips so the modules could be easily interchanged in the system.

While the ability to expand memory module capacity by adding memory chips is an advantage in designing systems, it creates a problem because access time increases as the number of chips increases and adds more loading to the signal drivers. Thus, the flexibility of design has a negative impact on system performance by requiring the clock to be slow enough to work with a module with a maximum number of memory chips. In similar fashion, use of modules with more than one bank of memory chips provides design flexibility, for example, by allowing use of modules with one or two banks populated with memory chips. But, it again creates the problem that a two-bank module typically has twice the loading on the signal drivers as a one-bank module which causes a longer memory access time and therefore the system clock must be slowed to accommodate the slowest modules, i.e. those with both banks filled.

SUMMARY OF THE INVENTION

A memory module is disclosed which has at least two memory chips and includes a signal buffer with at least two sets of outputs which replicate control and address signals and drive these signals to the memory chip inputs. The signal buffer outputs are coupled to subsets of the total number of memory chips so that loading on each output is less than the total loading of all chip inputs, resulting in reduced access time. The buffer and memory chips are positioned, and signals are routed, to reduce and equalize the loading on each driver and thereby reduce memory access time.

In another embodiment, a memory module has locations for mounting multiple banks of memory chips (two banks in the specific embodiment of the invention described herein), but is designed to be fully functional with a single bank of memory chips. Each module includes signal drivers having a plurality of sets of outputs replicating a set of input signals, with each output set coupled to a separate bank. Memory access time is the same whether one bank or multiple banks are populated with memory chips.

A computer memory may be expanded by using only modules which have substantially equal access time regardless of capacity of the module.

Figure 1:
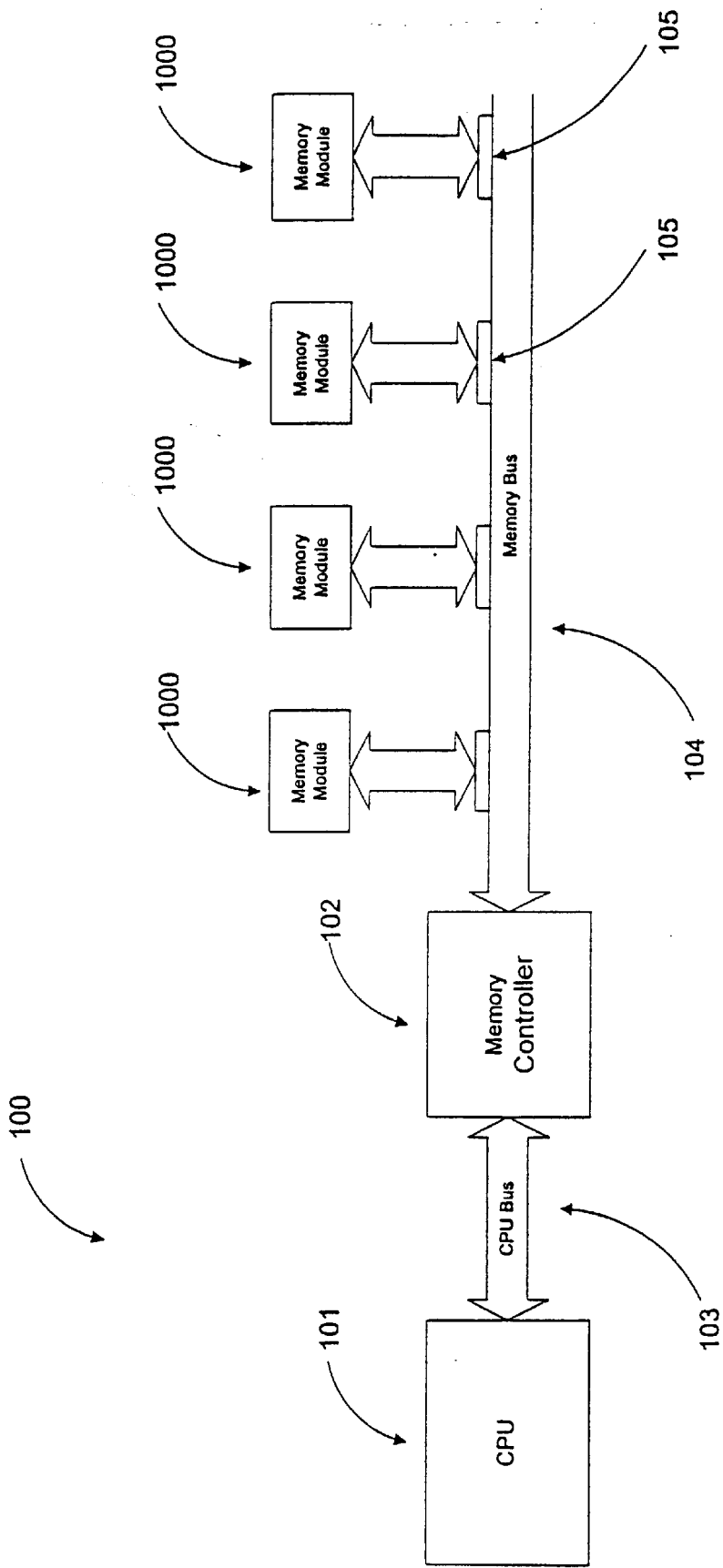
FIG. 1 is a block diagram illustrating a computer system having a CPU, a memory controller, a CPU bus, and a plurality of memory modules; and, FIG. 2 is a block diagram illustrating the electrical connections associated with an embodiment of a memory module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE INVENTION

With reference to FIG. 1, a computer system 100 including expansion memory modules 1000 is shown. The computer system 100 includes a central processing unit, CPU, 101 coupled to a memory controller 102 through CPU bus 103. The memory controller 102 is coupled to each of the memory modules 1000 through a memory bus 104. In this embodiment, the memory modules 1000 are provided to expand the main memory of computer system 100, and are coupled to memory bus 104 through a set of expansion sockets 105.

Figure 2:
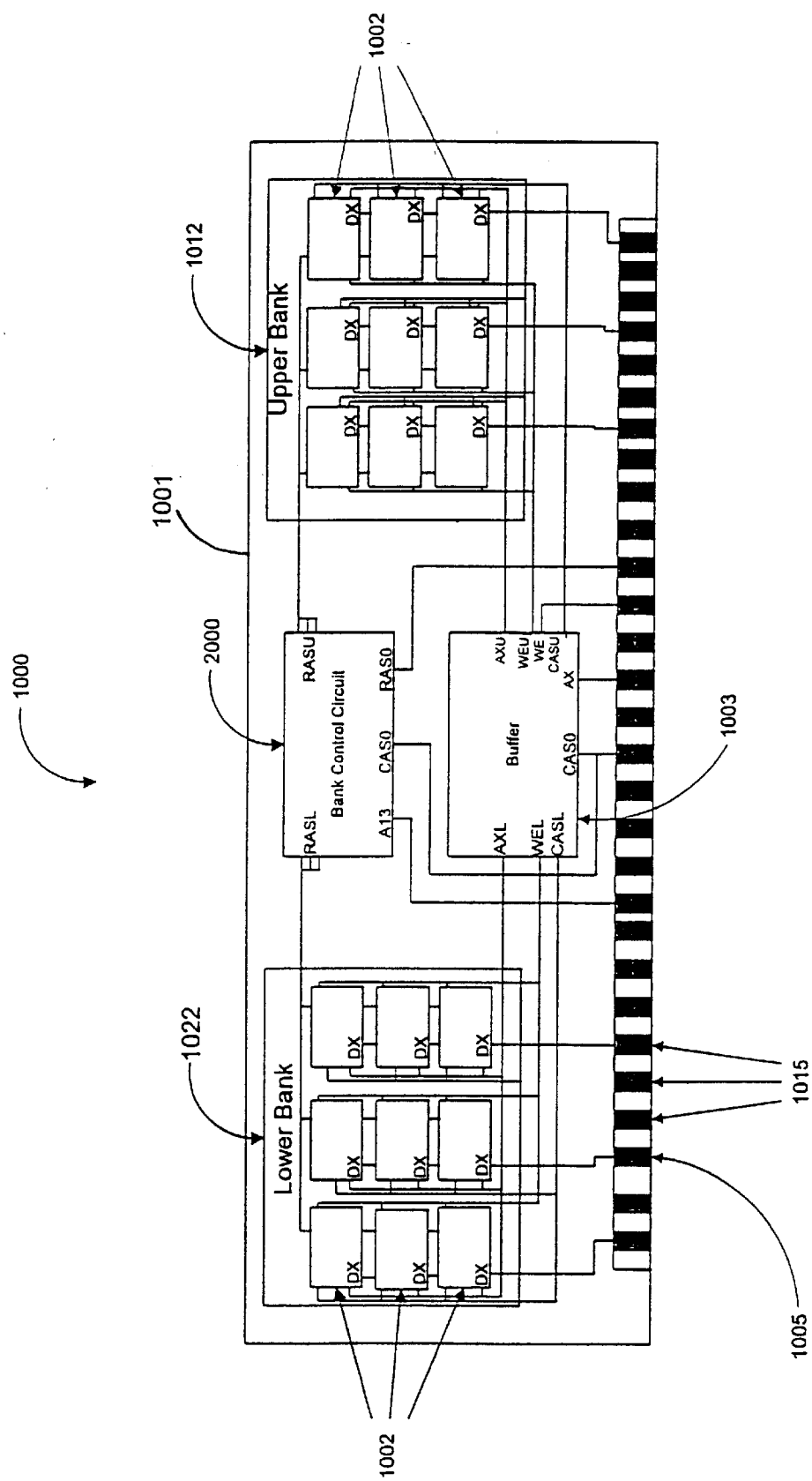

FIG. 2 is block diagram illustrating the electrical connections associated with one embodiment of a memory module. Memory module 1000 is assembled on a multi-layer printed circuit board 1001 having an edge connector 1005 formed on one edge. The memory module 1000 includes an upper memory bank 1012, a lower memory bank 1022, a bank control circuit 2000 and a buffer 1003. Each memory bank includes a number of memory chips 1002, in this case nine chips. The edge connector 1005 includes a plurality of electrical contact pads 1015, usually on both sides of board 1001, which convey signals between the memory module 1000 and the system memory bus. Edge connector 1005 is adapted for mounting in a socket 105 within a computer system.

Buffer 1003 receives signals WE (write enable), CAS0 (column address strobe 0) and a plurality of address signals, designated AX from the memory controller 102. Buffer 1003 drives a plurality of address signals AXL and AXU, which are conveyed to the lower memory bank 1022 and the upper memory bank 1012, respectively. The signals AXL and AXU are identical sets of address signals, each being a replication of the address signals AX provided by the computer memory controller 102. WEL and WEU are write enable signals driven by buffer 1003 to the lower memory bank 1022 and the upper memory bank 1012, respectively. WEL and WEU are identical replications of the WE signal provided by the memory controller 102. CASL and CASU are identical replications of the CAS0 signal and are driven by the buffer 1003 to the lower memory bank 1022 and the upper memory bank 1012, respectively.

The bank control circuit 2000 is configured to receive address signal A13 for selecting either the lower memory bank 1022 or the upper memory bank 1012. Address signal A13, in this embodiment, is the most significant address bit of an address bus which is fourteen bits wide. Bank control circuit 2000 is also configured to receive the CAS0 signal and a RAS0 (row address strobe 0) signal. Bank control circuit 2000 replicates the RAS0 signal to produce RASL and RASU signals which are coupled to the lower memory bank 1022 and the upper memory bank 1012, respectively. However, only one of the RASL and RASU signals is coupled to a bank during each read and write operation as the means of selecting which bank is active for the particular operation.

A plurality of data lines, represented in the drawings as DX, convey data signals between the memory chips 1002 and system memory bus 104 of FIG. 1. In this embodiment, each memory chip 1002 stores sixteen bits of data at each memory location and there are nine chips 1002 in each bank, so that the total data path, DX, is 144 bits wide. The data lines from the upper and lower memory banks 1012 and 1022 are connected to the same set of 144 contact pads 1015 on edge connector 1005, since only one of the banks is active at any one time.

As discussed above, the buffer 1003 receives various control and address signals and replicates each input signal to provide two identical outputs, with one of each duplicate output coupled to appropriate address and control inputs of the two banks 1012 and 1022 of memory chips 1002. Buffer 1003 may comprise one or more commercially available devices such as the SN74ALVCH162830 chip sold by Texas Instruments Incorporated.

In FIG. 2, there are eighteen memory chips 1002 divided into two memory banks of nine chips each. In this embodiment, the chips are SDRAM chips which are addressed by rows and columns. Each chip stores sixteen bit words, so that the data bus width is 144 bits, i.e. nine chips 1002 times sixteen bits. Typically sixteen of these bits are error check bits, so that the actual data path may be 128 bits which may form sixteen eight-bit bytes or eight sixteen-bit words. Suitable chips may have various total storage capacities. The total memory capacity of the module is the sum of the capacities of all the chips 1002 on the board 1001. By splitting the chips into the two banks 1012 and 1022 and driving each bank with separate outputs of the buffer 1003 and bank control circuit 2000, the loading characteristics and access time are essentially the same as for a module having only nine chips, i.e. having only one bank of chips.

This arrangement of the module 1000 also provides flexibility in selecting chips 1002. For example, the same total memory capacity can be achieved by use of one bank of chips 1002 having eight megabyte of address space as by use of two banks of chips 1002 having four megabyte of address space. One bank can be left unpopulated with chips 1002. However, since each bank is driven by its own drivers, the access time of the module will be the same regardless of how the same total capacity is achieved.

While buffer 1003 replicates the address signals and most of the control signals, the bank control circuit 2000 provides replication of the RAS, row address strobe, signal needed for addressing the memory chips 1002. This also assures that the input loading for these control signals will be the same, regardless of whether one or both banks of memory are installed on the module 1000.

In an alternate embodiment, bank selection may be made directly by the memory controller 102. In that case, the signals shown as outputs of bank control circuit 2000 are provided by controller 102 and coupled by the bus 104 to the module 1000. These signals are then coupled through the buffer 1003 or another equivalent buffer for driving the control signals to the memory chips 1002.

In FIG. 2, the buffer 1003 and the bank control circuit 2000 are shown positioned near the center of the module 1000. The memory banks 1012 and 1022 are shown positioned symmetrically on either side of the buffer 1003 and the bank control circuit 2000. This arrangement is desirable to help balance the loads on the buffer outputs. The printed circuit board conductors which carry the signals from the buffer 1003 and the bank control circuit 2000 to the memory chips 1002 represent part of the load on the buffer outputs and affect the settling time for the signals going to the memory chips 1002 and therefore the memory access time. These conductors should be as short as possible and ideally would have substantially the same loading effect on the buffer outputs. While it is not practical for the conductors to all have identical loading effect, it is possible by symmetric placement of parts to minimize loading and to provide similar loading effect on each buffer output. The effect of minimizing loading is to reduce the settling time of signals and overall access time, thus allowing a computer to operate at a higher clock speed. But it is also important for the loading on each buffer to be the same, because the computer clock speed must be set to accommodate the memory module with the longest access time.

For purposes of this application, the term access time is used to mean the minimum time required to perform a memory transaction, i.e. a read or write transaction, with a memory module. A computer using such memory modules must use a clock speed slow enough to have at least enough time in each clock period to complete such a memory transaction. One part of the access time is the settling time discussed above. That is, a read or write transaction cannot be reliably performed until enough time has passed to be sure that all control and address signals have actually reached the appropriate inputs of memory chips 1002. In the present embodiment this access time is reduced by use of buffer 1003 on a module with locations for two banks of memory chips 1002, which provides less loading on each driver output and thereby shortens access time. Use of the buffer 1003 also provides the same access time when both banks are filled with chips as when only one is filled with chips. The computer clock speed may therefore be set at a higher speed than would be possible if a single driver were used to drive a single bank with twice as many memory chips. By use of only the buffered modules described herein for memory expansion, no adjustment in clock speed is needed regardless of whether one or two banks are used on each module.

In FIG. 2, the module 1000 is shown with all of the memory chips 1002 mounted on one side of the printed circuit board. The chips may be mounted in various other topologies, for example on opposite sides of the board, so long as measures are taken to shorten total conductor length and equalize the conductor lengths as much as practical.

As discussed above, the concept of "banks" of memory in a module means that memory chips are divided into groups which share a set of data bus connections. Inherent in this concept is that each bank would have the same number of chips so that each bank would have the same total data bus width. In the embodiment of FIG. 2, the memory chips 1002 are divided into two banks and two sets of signal drivers are provided. However, the chips 1002 could be divided into a plurality of banks with each bank driven by a separate set of signal drivers, to further reduce access time and provide more flexibility in terms of selecting the chips 1002. In similar fashion, four sets of signal drivers could be used with two banks of chips 1002, i.e. with the inputs to chips in each bank divided into two sets driven by separate signal drivers, to further reduce driver loading and access time. By extension, a plurality of signal drivers could be used with any number of banks (including one) to divide the loading and reduce the access time.

The present invention includes an improved method of expanding computer memory and provides an improved computer system. The improved memory expansion method includes using memory modules as described herein to expand a computer's memory. By using this memory expansion method, a computer may be operated at a higher clock speed and, as a result, an improved computer system is provided.

In one embodiment, all memory modules used to expand computer memory would have a specified number, or a specified maximum number, of memory chip loads driven by each signal driver. For example, in the above-described embodiment, each driver has nine memory chip loads whether one or both memory banks are filled with memory chips. By using more drivers, the loading can be limited to a smaller number, e.g. use of six driver outputs would allow limiting the maximum loading to three memory chips. By thus limiting the maximum loading on the signal drivers, the access time is reduced and limited and clock speed can be set without concern that a slower module may be added to the system.

While the present invention has been illustrated and described in terms of particular apparatus and methods of use, it is apparent that equivalent parts may be substituted of those shown and other changes can be made within the scope of the present invention as defined by the appended claims.

We claim:

1. An expansion memory module for a computer system comprising:

a printed circuit board having a connector for connecting to said computer system, wherein said printed circuit board includes a plurality of mounting locations, each mounting location adapted for mounting a memory chip; and a line driver mounted to said printed circuit board having a plurality of inputs for receiving signals from said computer system and a plurality of outputs, wherein each of said plurality of inputs is replicated and output on at least two of said plurality of outputs, and wherein each of said at least two of said plurality of outputs being coupled to a respective subset of said mounting locations by conductors on said printed circuit board.

2. The expansion memory module of claim 1, wherein said line driver and said mounting locations are symmetrically positioned on said printed circuit board to minimize total conductor length between said line driver outputs and said mounting locations and to provide a total conductor length from each of said outputs to said mounting locations that is substantially the same.

3. The expansion memory module of claim 1 wherein each of said plurality of outputs is coupled to the same number of mounting locations.

4. The expansion memory module of claim 1 further including at least one memory chip mounted in one of said mounting locations.

5. The expansion memory module of claim 1 further including a memory chip mounted in each of said mounting locations.

6. The expansion memory module of claim 1 wherein said mounting locations are divided into at least two banks.

7. The expansion memory module of claim 6, wherein said mounting locations in each of said at least two banks are coupled to and share one set of data bus contacts on said connector.

8. The memory expansion module of claim 7 further comprising:
a bank control circuit having an input for receiving a bank selection signal, and having a plurality of selection outputs coupled to said at least two banks, said selection outputs causing one bank to actively drive said data bus contacts at any given time.

9. The memory expansion module according to claim 8, wherein each respective subset of said mounting locations is one of said at least two banks.

10. The memory expansion module of claim 8, wherein said bank control circuit has at least one address input for receiving address signals and at least two address outputs, wherein said address input is replicated and output on both said address outputs, and wherein said bank control circuit selects a given one of said at least two banks by driving only a corresponding one of said address outputs to a selected bank.

11. The expansion memory module of claim 10, wherein said plurality of inputs of said line driver are configured to receive memory address signals from said computer system.

12. A method for exchanging memory in a computer system, said method comprising:
coupling at least one memory module to a computer system, wherein said at least one memory module comprises;
a printed circuit board having a connector adapted for coupling to said computer system, wherein said printed circuit board includes a plurality of mounting locations, each mounting location adapted for mounting a memory chip; and
a line driver mounted to said printed circuit board having a plurality of inputs for receiving signals from said computer system and a plurality of outputs, wherein each of said plurality of inputs is replicated and output on at least two of said plurality of outputs, and wherein each of said at least two of said plurality of outputs being coupled to a respective subset of said mounting locations by conductors on said printed circuit board.

13. A method of claim 12 further comprising symmetrically positioning said line driver and said mounting locations on said printed circuit board to minimize total conductor length between said line driver outputs and said mounting locations.

14. A method of claim 13 further comprising symmetrically positioning said line driver and said mounting locations on said printed circuit board to provide a total conductor length between each of said outputs and said mounting locations that is substantially the same.

15. The method of claim 12 wherein said mounting locations are divided into at least two banks.

16. The method of claim 15, wherein said mounting locations in each of said at least two banks have a set of data connections coupled to and sharing one set of data bus contacts on said connector edge.

17. The method of claim 15 further comprising coupling a second memory module to said computer system, wherein said second memory module has memory chips mounted in mounting locations forming only one bank and said at least one memory module has memory chips mounted in mounting locations forming at least two banks.

18. The method of claim 15, further including replacing, in said computer system, a second memory module having memory chips mounted in only one bank of mounting locations with a third memory module having memory chips mounted in more than one bank of mounting locations.

19. The method of claim 15, further including:
removing a second memory module having memory chips mounted in only one bank of mounting locations from an expansion socket;
mounting memory chips on another bank of mounting locations on said second memory module; and,
inserting the second memory module into the expansion socket.

20. The method of claim 15, wherein each respective subset of said mounting locations is one of said at least two banks.

21. The method of claim 12 further comprising coupling each of said plurality of line driver outputs to the same number of mounting locations.

22. A method of reducing access time in a memory module having a plurality of memory chips comprising:
coupling a set of memory control signals to a set of inputs of a line driver, wherein each of said set of inputs is replicated and output on a plurality of sets of outputs; and
coupling each of said plurality of sets of outputs to a subset of said memory chips.

23. The method of claim 22 wherein said module is assembled on a printed circuit board further including
positioning said memory chips and said line driver on said printed circuit board to (i) minimize total conductor length required to couple signals from each line driver output to memory chip inputs and (ii) provide a total loading that is substantially the same on each line driver output.

24. The method of claim 22 further comprising organizing said memory chips into a plurality of banks and coupling one set of line driver outputs to the memory chips forming one bank.

25. The method of claim 22 further comprising dividing said memory chips into two banks and coupling one set of line driver outputs to the chips forming a first of said two banks and a second set of line driver outputs to the chips forming a second of said two banks.

26. The method of claim 22 wherein each subset of memory chips comprises the same number of memory chips.

* * * * *